United States Patent
Sim et al.

(10) Patent No.: US 7,463,493 B2
(45) Date of Patent: Dec. 9, 2008

(54) MODULE FOR TRANSFERRING PCB, APPARATUS FOR ATTACHING PCB AND LIQUID CRYSTAL DISPLAY DEVICE INCLUDING PCB

(75) Inventors: Chi-Seob Sim, Gumi-si (KR); Sung-Hoon Kim, Uijeongbu-si (KR)

(73) Assignee: LG. Display Co., Ltd., Seoul (KR)

( * ) Notice: Subject to any disclaimer, the term of this patent is extended or adjusted under 35 U.S.C. 154(b) by 293 days.

(21) Appl. No.: 11/304,014

(22) Filed: Dec. 14, 2005

(65) Prior Publication Data

US 2006/0285946 A1    Dec. 21, 2006

(30) Foreign Application Priority Data

Jun. 1, 2005   (KR) ............... 10-2005-0046744

(51) Int. Cl.
*H05K 1/11*   (2006.01)
(52) U.S. Cl. .................... 361/792; 29/739; 29/740; 29/832; 29/836

(58) Field of Classification Search ............... 361/792; 29/739, 740, 825, 832, 836; 198/346.2, 377.08, 198/445, 468.4, 803.9
See application file for complete search history.

(56) References Cited

U.S. PATENT DOCUMENTS

| | | | |
|---|---|---|---|
| 6,087,839 A * | 7/2000 | Choi | 324/754 |
| 6,374,484 B1 * | 4/2002 | Yoshida et al. | 29/740 |
| 6,701,611 B1 * | 3/2004 | Izumida et al. | 29/832 |
| 2002/0000359 A1 * | 1/2002 | Asai et al. | 198/346.2 |

* cited by examiner

*Primary Examiner*—Dean A. Reichard
*Assistant Examiner*—Xiaoliang Chen
(74) *Attorney, Agent, or Firm*—Brinks Hofer Gilson & Lione (57) ABSTRACT

A module for transferring a PCB including a first transfer body that is translatable along a first moving path to transfer a first PCB and a second transfer body that is translatable along a second moving path to transfer a second PCB with the second transfer body being formed with an aperture therein. Additionally the first transfer body is adjustable from a first position where the first transfer body does not fit through the aperture to a second position wherein the first transfer body can fit within the aperture.

12 Claims, 6 Drawing Sheets

MODULE FOR TRANSFERRING PCB, APPARATUS FOR ATTACHING PCB AND LIQUID CRYSTAL DISPLAY DEVICE INCLUDING PCB

The present invention claims benefit of Korean Patent Application No. P2005-0046744, filed in Korea on Jun. 1, 2005, which is hereby incorporated by reference.

BACKGROUND OF THE INVENTION

1. Field of the Invention

The present invention relates to a module for transferring a printed circuit board (PCB) during manufacture and an apparatus for attaching a PCB to a liquid crystal display device.

2. Background of the Related Art

PCBs have commonly been used to operate electric devices, such as display devices. A PCB is fabricated by printing signal lines on a glass fiber or a plastic substrate and attaching electric elements to the substrate. Recently, due to rapid development of semiconductor integration technology, a TCP (tape carrier packaging) technology for wireless bonding has been suggested as a packaging technology for LSI (large scale integration), VLSI (very large scale integration) and ULSI (ultra large scale integration) semiconductor chips. The TCP technology is a packaging technology that uses TAB (tape automated bonding) technology where a semiconductor chip is joined with a film and sealed up with resin, and the TCP technology includes COF (chip on film or chip on flexible printed circuit).

As the TCP technology has been employed, the range of appropriate uses of a PCB has increased. For example, a PCB can be used to operate a liquid crystal display (LCD) device with the TCP film.

Figure 1:
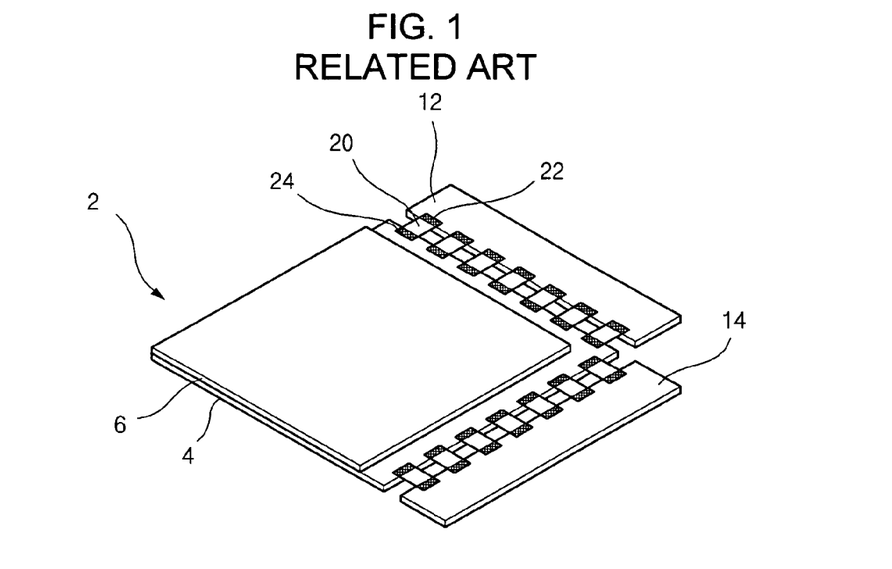
FIG. 1 is a perspective view illustrating a related art liquid crystal panel connected to PCBs with TCP films.

As illustrated in FIG. 1, a liquid crystal panel 2 includes first and second substrates 4, 6, with a liquid crystal layer between the two substrates 4, 6. The liquid crystal panel 2 is connected to gate and data PCBs 12, 14. The liquid crystal panel 2 is normally operated as an active matrix. On an inner surface of the first substrate 4, a plurality of gate and data lines are arranged to define a plurality of pixel regions in a matrix form. A plurality of thin film transistors are arranged at crossing portions of the gate and data lines and connected to a plurality of pixel electrodes in the plurality of pixel regions. The inner surface of the second substrate 6 includes a black matrix that provides shielding to the gate and data lines and the thin film transistor, a color filter located in the pixel region, and a common electrode where the black matrix and the color filter are arranged.

The gate PCB 12 is connected to the gate lines to supply gate signals to the gate lines. The data PCB 14 is connected to the data lines to supply data signals to the data lines. For example, the gate PCB 12 may sequentially supply On gate signals to the gate lines, which sequentially turns on the thin film transistors. When the thin film transistors are turned on, data signals are supplied to the pixel electrodes through the data lines. Since the common electrode is supplied with a common voltage, an electric field is induced in the liquid crystal layer by a voltage difference between the pixel electrode and the common electrode. The alignment of the liquid crystal molecules in the liquid crystal layer changes in accordance with the intensity and direction of the induced electric field, thereby changing the light transmissivity of the LCD device. A backlight unit (not shown) is disposed below the liquid crystal panel 2, to supply light to the liquid crystal panel 2.

The PCBs 12, 14 are connected to the liquid crystal panel 2 through at least one TCP film 20. The TCP film 20 is attached to the PCBs 12, 24 and the liquid crystal panel 2 through first and second anisotropic conductive films (ACFs) 22, 24 that form conductive bonding agents at both ends of the TCP film 20.

Connection of the PCBs 12 and 14 to the liquid crystal panel 12 is conducted as follows. The steps of adhering the first ACF 22 to the PCBs 12, 14 and attaching the TCP 20 to the liquid crystal panel 2 with the second ACF 24 are performed separately. The PCBs 12, 14 are attached to the TCP 20, which was previously attached to the liquid crystal panel 2, with the first ACF 22 adhered to the PCBs 12, 14. These attaching processes are conducted in a PCB attaching apparatus.

Figure 2:
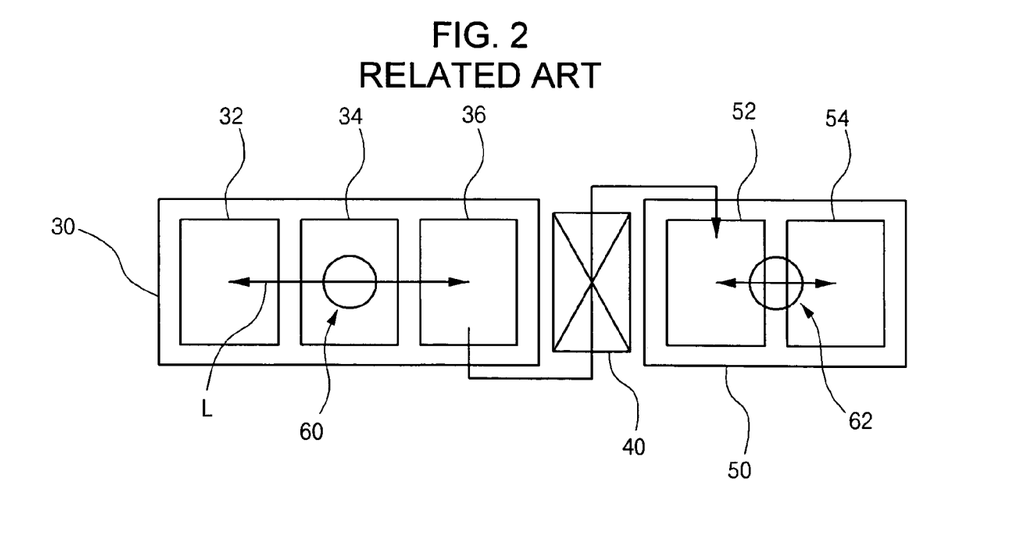
FIG. 2 is a block diagram illustrating a related art PCB attaching apparatus.

As illustrated in FIG. 2, a related art PCB attaching apparatus includes a first attaching portion 30, a second attaching portion 50 and a delivery device 40 connecting the first and second attaching portions 30, 50. The first attaching portion 30 includes a loading part 32, a first attaching part 34, and an unloading part 36. The second attaching portion 50 includes an inspection part 52 and a second attaching part 54.

The first attaching portion 30 further includes a PCB transfer module 60 transferring a PCB (12, 14 of FIG. 1) in the first attaching portion 30. The PCB transfer module 60 makes a trip along a moving path L and passes the loading part 32, the first attaching part 34, and the unloading part 36. The PCB supplied to the loading part 32 is transferred to the first attaching part 34 using the PCB transfer module 60 where an ACF (22 of FIG. 1) is adhered to the PCB, then the PCB with the ACF 22 is transferred to the unloading part 36 using the PCB transfer module 60.

The PCB at the unloading part 36 is delivered to the inspection part 52 with a delivery device 40 such as a pickup robot. In the inspection part 52, the electrical connection between the bonded PCB and ACF are inspected.

The PCB with the ACF is then transferred to the second attaching part 54. At this time, the TCP film (20 of FIG. 1) that previously was attached to a liquid crystal panel (2 of FIG. 1) with another ACF (24 of FIG. 1) is prepared. Accordingly, the PCB is attached to the TCP film with the ACF previously adhered to the PCB. Meanwhile, the second attaching portion 50 may further include another transfer module 62 that transfers the PCB from the inspection part 52 to the second attaching part 54.

Figure 3:
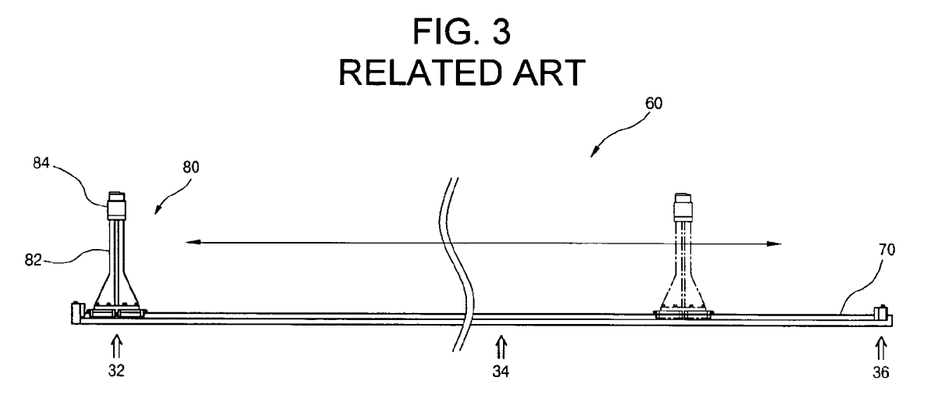
FIG. 3 is a side view illustrating a related art PCB transfer module of FIG. 2.

As illustrated in FIG. 3, the PCB transfer module 60 includes a pair of guide rails 70 and a transfer body 80. The guide rails 70 pass though a loading part 32, a first attaching part 34 and an unloading part 36 along the moving path (L of FIG. 2) of the transfer module 60, with the transfer body 80 sliding forward and backward on the guide rails 70. The transfer body 80 includes a supporter 82 that fixedly supports a plate 84. The PCB is placed on the plate 84 to be transferred. Accordingly, the transfer body 80 transfers the PCB between the loading part 32 and the unloading part 36.

Because the related art PCB attaching apparatus and the PCB attaching method depend on a single transfer body 80 to transfer the PCB between stations, total process time is longer than necessary, which makes production inefficient.

Specifically, the number of the LCD devices fabricated in the second attaching portion 50 is limited by the number of cycles the transfer body 80. Additionally, the PCB attaching process is completely stopped when the transfer body 80 is secured for repairs. In addition, the transfer module 62 of the second attaching portion 50 remains idle while the transfer body 80 transfers the PCB from the loading part 32 to the unloading part 36 via the first attaching part 34, and also while the transfer body 80 returns to the loading part 32 without the PCB and transfers new PCB to the unloading part 36. Therefore, efficiency of the related art PCB attaching apparatus is greatly reduced with use of the transfer module 62 of the second attaching portion 60.

To solve these problems, the speed of the transfer body may be increased. However, the speed of the transfer body must be limited to maintain stability. Alternatively, multiple guide rails and multiple transfer bodies can be used. However, the multiple transfer bodies start at the same loading part 32, return to the same unloading part 36, and meet at the same first attaching part 34. Accordingly, the use of multiple transfer bodies would require waiting a period of time to avoid bottlenecks at the starting point, the meeting point, and the returning point. Additionally, if the PCB attaching apparatus was provided with multiple transfer bodies would need a large installation space.

SUMMARY OF THE INVENTION

A module for transferring a printed circuit board is provided that includes a first transfer body that is translatable along a first moving path to transfer a first printed circuit board and a second transfer body that is translatable along a second moving path to transfer a second printed circuit board. The second transfer body may be formed with an aperture. The first transfer body may be adjustable from a first orientation where the first transfer body does not fit through the aperture to a second orientation wherein the first transfer body can fit within the aperture.

A module for transferring a PCB includes a first transfer body making around trip along a moving path to transfer a first PCB, and a second transfer body making around trip along the moving path to transfer a second PCB. The second transfer body has an aperture therein, wherein a height of the first transfer body is adjustable such that the first transfer body penetrates through the aperture.

An apparatus for attaching a PCB to an object device may include a first attaching portion for attaching an ACF to each of first and second PCBs and including a plurality of parts that move along a moving direction, and a second attaching portion for attaching each of the first and second PCBs to the object device. The first and second transfer bodies each make a round trip along the moving path to transfer the first and second PCBs, respectively. Additionally, the second transfer body includes an aperture therein, and the height of the first transfer body is adjustable to allow that the first transfer body to penetrate through the aperture of the second transfer body.

In another aspect, a liquid crystal display device having a PCB includes a liquid crystal panel, and a TCP film attached to the liquid crystal panel, wherein the PCB is attached to the TCP film attached to the liquid crystal panel with an apparatus for attaching a PCB to an object device. The apparatus includes a first attaching portion for attaching an ACF to each of first and second PCBs and a plurality of parts along a moving path, a second attaching portion for attaching each of the first and second PCBs to the object device, and first and second transfer bodies that make a round trip along the moving path to transfer the first and second PCBs. The second transfer body includes an aperture therein, and the height of the first transfer body is adjustable to allow the first transfer body to penetrate through the tunnel space.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the illustrated embodiments of the present invention, which are illustrated in the accompanying drawings.

Figure 4:
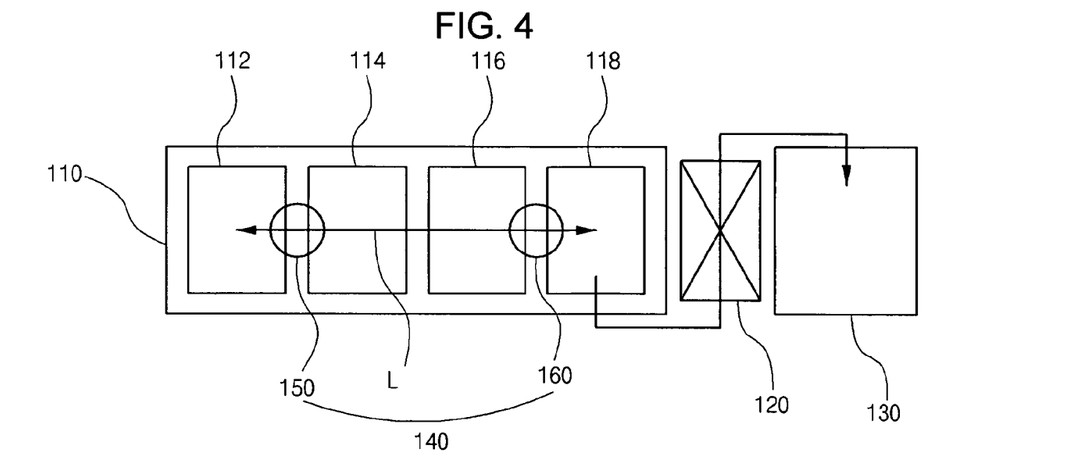
FIG. 4 is a block diagram illustrating a PCB attaching apparatus according to an embodiment of the present invention.

As illustrated in FIG. 4, a printed circuit board (PCB) attaching apparatus includes first attaching portion 110, a second attaching portion 130, and a delivery device 120 connecting the first and second attaching portions 110 and 130. The PCB used with this design may be a PCB used with a liquid crystal display (LCD) device.

The first attaching portion 110 includes a loading part 112, a first attaching part 114, an inspection part 116, an unloading part 118, and a PCB transfer module 140. The PCB transfer module 140 includes first and second transfer bodies 150 and 160 that each make round trips along a moving path L, while sequentially passing the loading part 112, the first attaching part 114, the inspection part 116, and the unloading part 118.

A PCB is loaded on each transfer body 150 and 160 at the loading part 112 from outside of the system described here. The first attaching part 114 attaches an anisotropic conductive film (ACF) to the PCB transferred from the loading part 112. The inspection part 116 inspects the electric connections and the alignment of the ACF attached to the PCB. The inspected PCB having the ACF is unloaded from each transfer body 150 and 160 at the unloading part 118 with the delivery device 120. The delivery device 120 delivers the PCB from the unloading part 118 to the second attaching portion 130 and may include a pickup robot.

The second attaching portion 130 attaches the PCB with the ACF to a target object, for example, a liquid crystal panel where a tape carrier packaging (TCP) film that includes another ACF is attached. A process of attaching the TCP film to the liquid crystal panel is conducted separately from a process of attaching the ACF to the PCB, and then the liquid crystal panel having the TCP film is supplied to the second attaching portion 130. Accordingly, the PCB is attached to the TCP film, which was previously attached to the liquid crystal panel, in the second attaching portion 130 to finish the process of electrically connecting the PCB to the liquid crystal panel.

The first attaching part 114 may have a heating tool to attach the ACF to the PCB effectively. In addition, the inspection part 116 may have a camera and a light source to inspect the electric connection and alignment. In addition, the second attaching portion 130 may have another heating tool to attach the PCB to the liquid crystal panel effectively.

In the PCB attaching apparatus of the exemplary embodiment, the inspection part 116 is disposed in the first attaching portion 110, in contrast to the related art PCB attaching apparatus, which is possible because the two transfer bodies 150 and 160 are used for the PCB transfer module 140.

In other words, since the first and second transfer bodies 150, 160 are arranged in the first attaching portion 110 to separately transfer the PCBs, the amount of the PCBs transferred to the unloading part 118 is almost twice the number of the PCBs transferred to the related art unloading part 36. Because a bottleneck may be generated at the unloading part 118 if the amount of processes conducted in the second attaching portion increases, to substantially eliminate the probability of a pile-up of PCBs at the unloading part 118, the inspection part 116 is arranged in the first attaching portion 110, and particularly between the first attaching part 114 and the unloading part 118 to increase the cycle time in the first attaching portion 110.

The PCB transfer module is explained in more detail with reference to FIGS. 4 through 6C. A pair of first guide rails 142 and a pair of second guide rails 144 are arranged along the same moving path (L of FIG. 4). In particular, the first guide rails 142 are disposed in parallel and within the second guide rails 144. The first and second transfer bodies 150, 160 are connected to the first and second guide rails 142, 144, respectively, and separately move forward and backward in a sliding manner along the first and second guide rails 142, 144.

Figure 5:
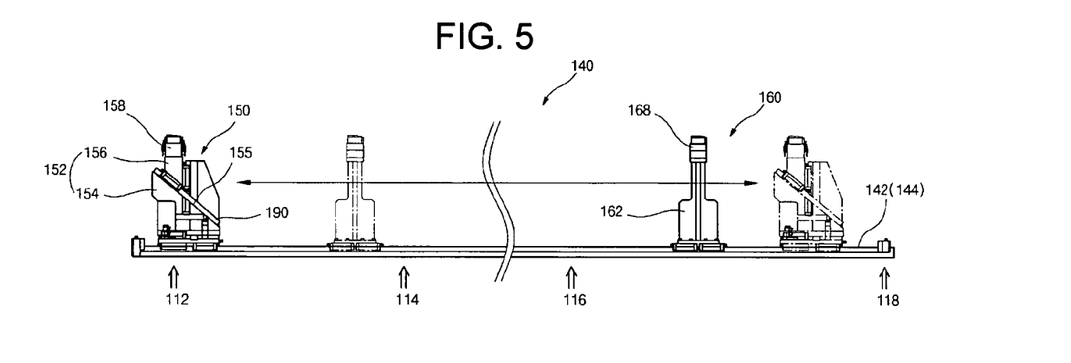
FIG. 5 is a side view illustrating the PCB transfer module of FIG. 4.

The first transfer body 150 is constructed to have an adjustable height, and the second transfer body 160 includes a tunnel space, or an aperture, A that provides room for the first transfer body 150 to translate through the aperture A.

The first transfer body 150 includes a first supporter 152 that translates on the first guide rails 142 in a sliding manner and a first plate 158 fixed on the first supporter 152 that is adapted for holding the PCB thereon. The first supporter 152 includes a lower piece 154 contacting the first guide rails 142 and an upper piece 156 that is movable with respect to the lower piece 154. An oblique fault plane 155 is disposed between the lower and upper pieces 154, 156 such that the upper piece 156 is movable upward and downward along the oblique plane 155. As the upper piece 156 ascends and descends along the oblique fault plane 155, the height of the first transfer body 150 above the first guide rail 142 changes.

The oblique fault plane 155 may be formed to cross the moving path such that the size of the aperture A can be minimized. As can be understood with reference to the figures, upward and downward movement of the upper piece 156 causes corresponding upward and downward movement of the first plate 158 fixed on the upper piece 156. In addition, a pair of linear motion guides 190 may be arranged in parallel to the oblique fault plane 155. The linear motion guides 190 are fixed on the lower piece 154 and contact a lower surface of the oblique fault plane 155 and obliquely extended outside the plane 155. Accordingly, the upper piece 156 is effectively movable upward and downward along the linear motion guides 190. Therefore, by using the linear motion guides 190, the height of the first transfer body 150 can be precisely adjusted.

The second transfer body 160 includes a second supporter 162 that translates along the second guide rails 144 in a sliding manner and a second plate 168 fixed on the second supporter 162 that is adapted for holding the PCB thereon. The second supporter 162 includes two pieces that each contact one of the second guide rails 144. The second supporter 162 having the two pieces and the second plate 168 defines the aperture A.

When the first transfer body 150 is arranged in a first orientation with the greatest height, the first plate 158 has substantially has the same position as the second plate 168. Therefore, the first and second plates 158, 168 can effectively share the loading part 112, the first attaching part 114, the inspection part 116, and the unloading part 118. When the first transfer body 150 is arranged with the lowest height, the plate 158 is lower than the top of aperture A, which allows the first transfer body 150 to penetrate through the aperture A. The height of the first transfer body 150 is adjustable by changing the angle of the oblique fault plane 155 and the length of the linear motion guides 190.

Figure 6A:
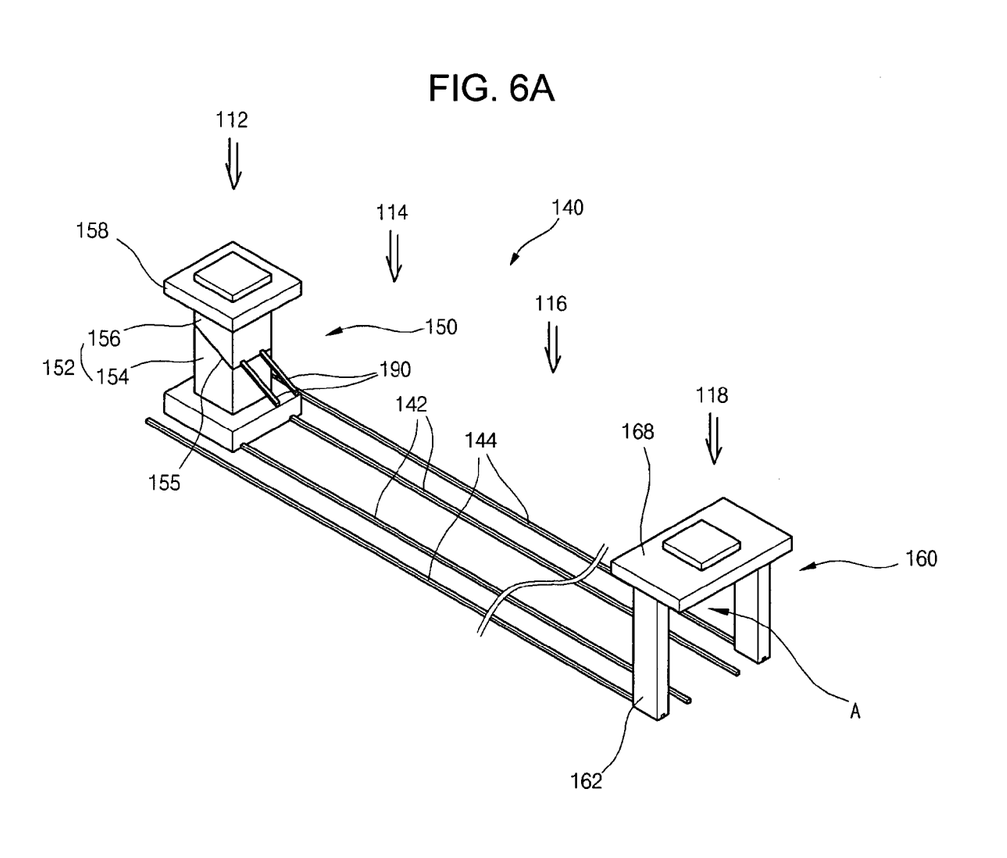
FIG. 6A is a perspective view of the PCB transfer module of FIG. 5 in a first position.

As illustrated in FIG. 6A, the first transfer body 150 is in the first orientation at the loading part 112, when the PCB is supplied to the first plate 158. The first transfer body 150 then translates along the first guide rails 142 toward the unloading part 118 by way of the first attaching part 114 and the inspection part 116. At this location the first transfer body 150 meets the second transfer body 160 that moves at regular intervals with the first transfer body 150.

Figure 6B:
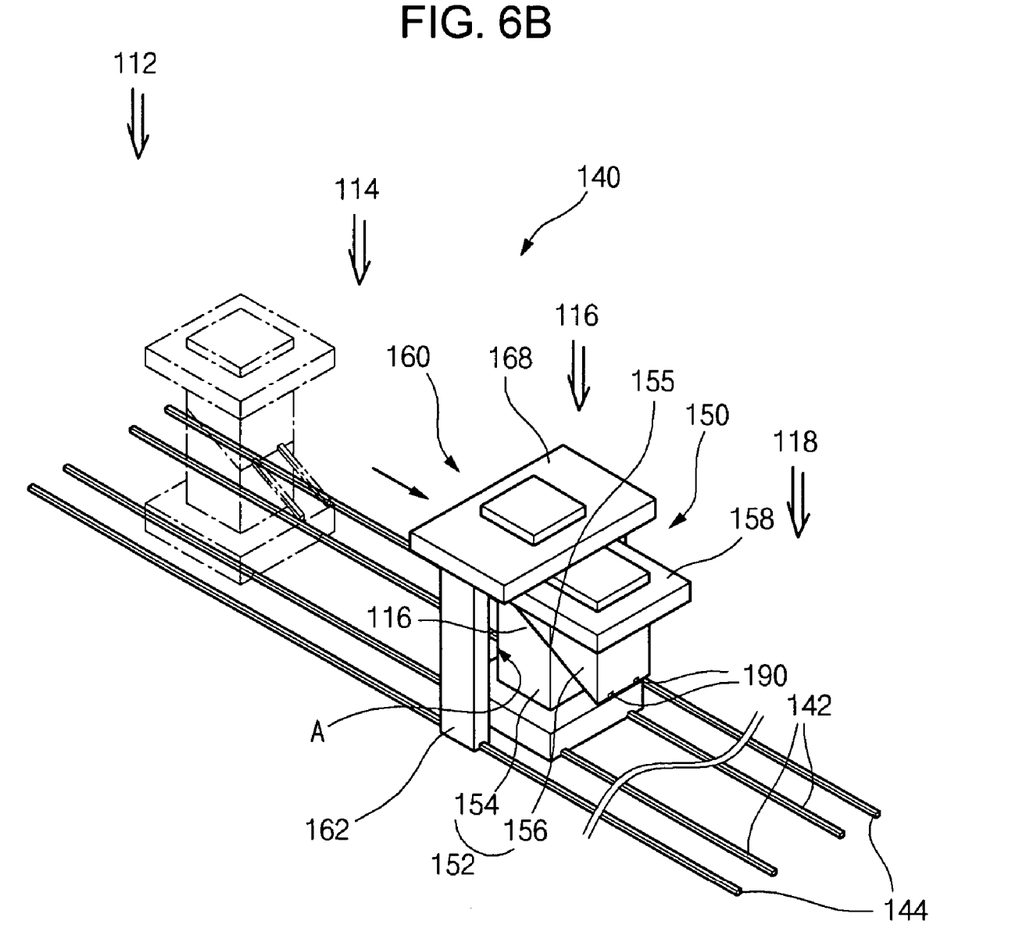
FIG. 6B is a perspective view of the PCB transfer module of FIG. 5 in a second position.

As shown in FIG. 6B, when the first and second transfer bodies 150, 160 meet each other, the upper piece 156 descends along the oblique fault plane 155 such that the height of the first transfer body 150 decreases until the first transfer body 150 can fit within the aperture A. To reduce process time, the first and second transfer bodies 150, 160 may move along their respective rails 142, 144 with the same constant speed so that the first and second transfer bodies 150, 160 meet each other at regular and consistent intervals. Additionally, to conduct the processes stably, the first and second transfer bodies 150, 160 may meet between different stations, or parts, 112, 114, 116 and 118 of the first attaching portion 110 to avoid motion of the first transfer body 150 at one of these stations.

Figure 6C:
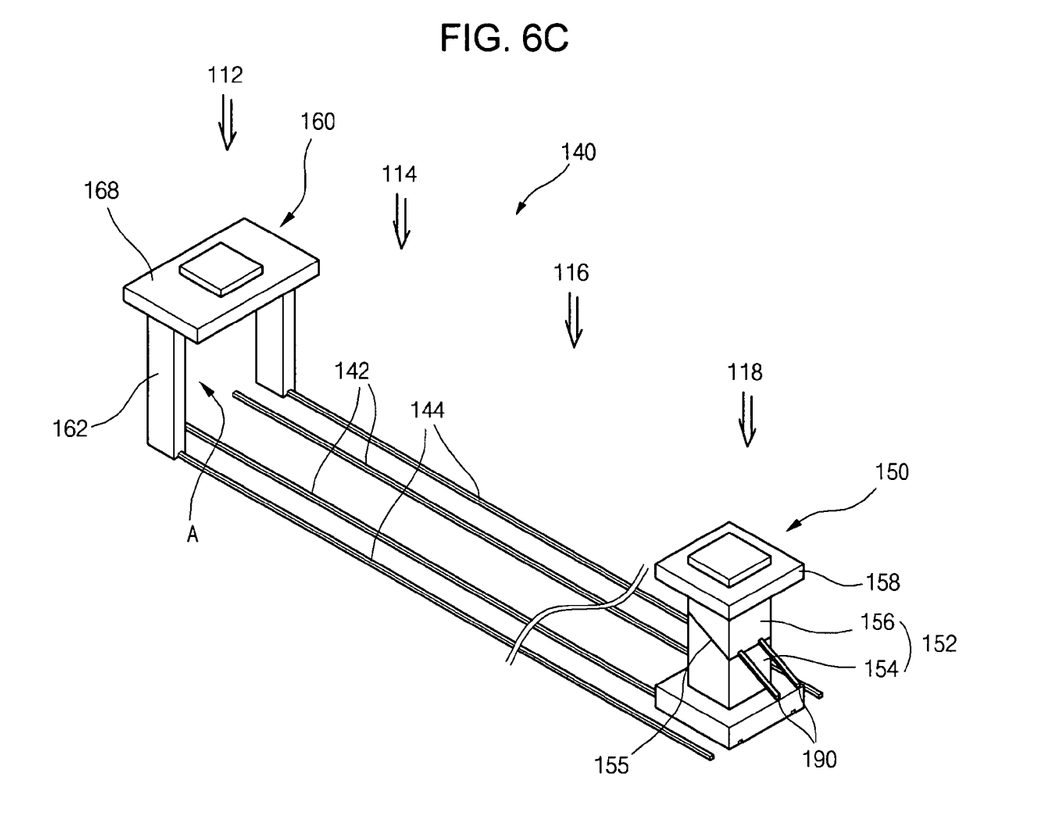
FIG. 6C is a perspective view of the PCB transfer module of FIG. 5 in a third position.

As shown in FIG. 6C, when the first transfer body 150 exits the aperture A, the upper piece 156 ascends along the oblique fault plane 155 until the first transfer body 150 returns to the first orientation and becomes substantially the same height as the second transfer body 160. At this point, the first transfer body 150 arrives at the unloading part 118 and the PCB on the first transfer body 150 is delivered by the delivery device 120.

A PCB may be loaded on each of the first and second transfer bodies 150 and 160 at the loading part 112. The first and second transfer bodies 150, 160 have the PCB loaded thereon at regular intervals. Each of the first and second transfer bodies 150, 160 then transfers the PCB sequentially to the first attaching part 114, which attaches the ACF to the PCB, then to the inspection part 116, which inspects the attached ACF and PCB, and then to the unloading part 118, which delivers the inspected ACF and PCB. When the first and second transfer bodies 150 and 160 meet each other during movement of the first and second transfer bodies 150 and 160, the upper piece 156 of the first transfer body 150 descends toward the second orientation and penetrates the second transfer body 160, as explained above.

When each of the first and second transfer bodies 150, 160 arrives at the unloading part 118, the delivery device 120 removes the PCBs from the first and second transfer bodies 150, 160 to the second attaching portion 130. Each of the first and second transfer bodies 150, 160 then returns to the loading part 112 and repeats the process discussed above. Meanwhile, the PCB delivered to the second attaching part 130 is attached to the TCP film that was previously attached to the liquid crystal panel.

The PCBs transferred by the first and second transfer bodies 150 and 160 may be the same type PCBs or the different type PCBs. For example, the first and second transfer bodies 150 and 160 transfer the gate and data PCBs (12 and 14 of FIG. 1), respectively.

Although not shown in the drawings, after attaching the PCB to the liquid crystal panel, a backlight unit is arranged below the liquid crystal panel and the liquid crystal panel and the backlight unit are combined using modular members to fabricate the liquid crystal display module. The modular members include a main support bracket that surrounds peripheral portions of the liquid crystal panel and the backlight unit, a bottom cover that may cover the bottom surface of the backlight unit and in combination with the main support bracket, and a top cover surrounding peripheral portions of a top surface of the liquid crystal panel. When combined with the modular members, the PCB that is connected to the liquid crystal panel with the flexible TCP film is disposed at the side of the main support bracket or at the bottom of the bottom cover according to bending of the flexible TCP film.

As explained above, the PCB attaching apparatus can have high attaching efficiency and thus can improve the overall production efficiency of the LCD device. The two transfer bodies may transfer the PCBs without waiting time, and thus the number of the PCBs that can be processed can be about two times more than the related art. In addition, since the PCBs are inspected in the first attaching portion, the number of the PCBs transferred is increased, while the burden on the second attaching portion 130 can be reduced, which increases overall productivity of the overall process. Therefore, the PCB attaching efficiency and the production efficiency of the LCD device can be improved greatly.

It will be apparent to those skilled in the art that various modifications and variations can be made in a module for transferring a printed circuit board, an apparatus for attaching a printed circuit board, and a liquid crystal display device including a printed circuit board of the present invention without departing from the spirit or scope of the invention. For instance, the present invention may also be applied to other display devices. Therefore, it is intended that the present invention cover the modifications and variations of this invention provided they come within the scope of the appended claims and their equivalents.

What is claimed is:

1. A module for transferring a printed circuit board, comprising:
   a first transfer body translatable along a first moving path to transfer a first printed circuit board; and
   a second transfer body translatable along a second moving path to transfer a second printed circuit board, the second transfer body being formed with an aperture therein,
   wherein the first transfer body is adjustable from a first orientation where the first transfer body does not fit through the aperture to a second orientation wherein the first transfer body fits within the aperture and
   wherein the first transfer body further comprises a first supporter that contacts the first moving path and a first plate for accepting the first printed circuit board thereon, the first supporter formed from a lower piece and an upper piece that are separated by an oblique fault plane.

2. The module according to claim 1, wherein the upper piece is translatable with respect to the lower piece along the oblique fault plane.

3. The module according to claim 1, wherein a linear motion guide is arranged along the oblique fault plane to guide the translation of the upper piece with respect to the lower piece.

4. The module according to claim 1, wherein the second transfer body includes a second supporter that contacts the second moving path and a second plate for accepting the second printed circuit board, wherein the second plate partially defines the aperture.

5. The module according to claim 1, wherein the first moving path comprises a pair of first guide rails wherein the second moving path comprises a pair of second guide rails, wherein the second guide rails are arranged parallel to and outside of the first guide rails.

6. The module according to claim 1, wherein the oblique fault plane crosses the first moving path.

7. The module according to claim 1, wherein the height of the first transfer body is substantially the same as a height of the second transfer body when the first transfer body is in the first orientation.

8. An apparatus for attaching a printed circuit board to an object device, comprising:
   a first attaching portion attaching an anisotropic conductive film to each of first and second printed circuit boards and including a plurality of parts that are disposed along a moving path;
   a second attaching portion for each of the first and second printed circuit boards to the object device; and
   a first transfer body and a second transfer body each being translatable along the moving path to transfer the first and second printed circuit boards, respectively, the second transfer body having an aperture therein,
   wherein a height of the first transfer body is adjustable such that the first transfer body may selectively pass through the aperture and
   wherein the first transfer body comprises a first supporter for contacting the moving path and a first plate adapted for receiving the first printed circuit board thereon, the first supporter comprises a lower and an upper piece and an oblique fault plane between the upper piece and the lower piece, the upper piece may translate with respect to the lower piece along the oblique fault plane.

9. The apparatus according to claim 8, wherein the first attaching portion includes a loading part for loading the first and second printed circuit boards on one of the first and second transfer bodies, an attaching part for attaching the anisotropic conductive film to one of the first and second printed circuit boards, an inspection part for inspecting a connection between the anisotropic conductive film and one of the first and second printed circuit boards, and an unloading part for unloading one of the first and second printed circuit board each having the anisotropic conductive film from the first and second transfer bodies.

10. The apparatus according to claim 8, wherein the second transfer body comprises a second supporter for contacting the moving path and a second plate for receiving the second printed circuit board thereon, wherein the second plate partially defines the aperture.

11. The apparatus according to claim 8, further comprising a delivery device for delivering each of the first and the second printed circuit boards from the first attaching portion to the second attaching portion.

12. The apparatus according to claim 8, wherein the object device is a liquid crystal display device.

* * * * *